United States Patent [19]
Uritsky et al.

[11] Patent Number: 5,267,017
[45] Date of Patent: Nov. 30, 1993

[54] METHOD OF PARTICLE ANALYSIS ON A MIRROR WAFER

[75] Inventors: Yuri S. Uritsky, Foster City; Harry Q. Lee, Mountain View, both of Calif.; Patrick D. Kinney, Coon Rapids, Minn.; Kang-Ho Ahn, Seoul, Rep. of Korea

[73] Assignee: Applied Materials, Inc., Santa Clara, Calif.

[21] Appl. No.: 886,541

[22] Filed: May 20, 1992

[51] Int. Cl.⁵ ............................................. G01B 11/00
[52] U.S. Cl. ..................................... 356/375; 356/72; 356/237
[58] Field of Search ............... 356/372, 375, 237, 72, 356/73

[56] References Cited

U.S. PATENT DOCUMENTS 4,659,220 4/1987 Bronte et al. ...................... 356/237

Primary Examiner—F. L. Evans
Attorney, Agent, or Firm—Noel F. Heal

[57] ABSTRACT

A method for reducing targeting errors encountered when trying to locate contaminant particles in a high-magnification imaging device, based on estimates of the particle positions obtained from a scanning device. The method of the invention uses three techniques separately and in combination. The first technique includes selecting at least three reference particles, to provide multiple unique pairs of reference particles for computation of an averaged set of coordinate transformation parameters, used to transform particle position coordinates from the coordinate system of the scanning device to the coordinate system of the imaging device. The averaged transformation parameters result in much smaller targeting errors between the estimated and actual positions of the particles. The targeting errors are further reduced by the use of multiple scans of the scanning device. In a third technique, accumulated reference particle targeting errors observed in prior processing of other wafers are used to reduce these targeting errors when processing a new wafer.

18 Claims, 3 Drawing Sheets

METHOD OF PARTICLE ANALYSIS ON A MIRROR WAFER

BACKGROUND OF THE INVENTION

This invention relates generally to techniques for the identification and analysis of contaminant particles on semiconductor wafers and, more particularly, to techniques for locating particles more reliably when using a high-magnification imaging device, such as a scanning electron microscope. Semiconductor fabrication technology today deals with wafer sizes up to 200 mm (millimeters) and feature geometries with dimensions well below 1 $\mu$m (micrometer). The presence of a particle larger than half the width of a conductive line on a wafer can lead to failure of a semiconductor chip made from the wafer. Therefore, a critical task facing semiconductor process engineers is to identify and, as far as possible, to eliminate sources of surface contamination.

A well known approach to identification and analysis of contaminant particles involves the use of a scanning electron microscope (SEM) to locate particles on an unpatterned semiconductor wafer, referred to as a mirror wafer. Scanning X-ray spectroscopy or optical microscopy systems may also be used for this purpose. Because critical particles sizes are in the range of 0.1–0.2 $\mu$m, the SEM must use a magnification of approximately 2000$\times$ to allow the smallest critical particles to be seen by the human eye, which has a resolution limitation of approximately 0.2 mm. At this high level of magnification, it is extremely difficult to find a particle on the wafer unless its position is known quite accurately before the SEM or similar system is used.

Because the SEM must be operated only at high levels of magnification, it is not a useful instrument to obtain an overview of particles on an entire wafer. Other devices have been developed for this purpose and a two-stage process for locating and analyzing particles is normally employed. In the first stage, the wafer is raster-scanned with a laser beam to locate practically all of the particles on the wafer or in an area of interest on the wafer. The manner in which the laser beam is scattered from the particles yields signals from which the sizes and locations of the particles can be deduced, for output to a computer display screen. However, because the scattering mechanism is not completely understood, the signals are of little help in identifying the type, chemical composition, and possible source of contaminant particles. This information can only be obtained with the help of a high-magnification imaging device, such as an SEM.

As already mentioned, locating a particle using an SEM can be extremely difficult or impossible unless the position of the particle is first known to some degree of accuracy. Specifically, at a magnification of 2000$\times$ a 0.1 $\mu$m particle must be "targeted" to an accuracy of about 37.5 $\mu$m in order to be located on the SEM viewing screen. Basically, the laser scanning technique provides estimated particle positions, in terms of x and y coordinates. To locate a particle of interest the SEM, the estimated coordinates for that particle are fed into the SEM, which, at high magnification, provides a view of only a very small part of the wafer. The targeting error is the distance between the estimated position of the particle and its actual position when viewed on the SEM viewing screen. If the targeting error is greater than about 37.5 $\mu$m, the particle will not even appear on the viewing screen and may never be located.

A critical aspect of this two-stage particle analysis method is that the coordinate system used in the laser scanning device must be transformed to the coordinate system used in the SEM or other similar device. The wafer has to be physically moved from one device to the other and there is no way to guarantee that the coordinate system used in the laser scanning device will still apply when the wafer is moved to the SEM. The wafer may be inadvertently rotated when it is moved from one device to the other, and the origins or zero reference points of the two coordinate systems will, in general, not be identical. Therefore, the particle coordinates obtained from the laser scanning device must be transformed to corresponding coordinates used in the SEM. This transformation is effected by identifying, in both devices, two reference particles that are relatively recognizable, because of their size and contrast. Given the coordinates of these two reference particles, as measured in the coordinate systems of both devices, a simple and well known coordinate transformation can be used to transform the other particle locations from one coordinate system to the other.

The two-stage particle location and analysis technique briefly described above has been used with some measure of success, but still has at least one significant disadvantage. It has been found that the accuracy with which the particles can be located depends in part on the positions of the particles selected as reference particles. Specifically, the targeting error may vary between 50 $\mu$m and 300 $\mu$m, depending on particle position on the wafer. As a result of this, nearly one-third of the particles may not be found using the SEM.

It will be appreciated from the foregoing that there is still need for improvement in the location and analysis of contaminant particles on semiconductor mirror wafers. The present invention is directed to this end.

SUMMARY OF THE INVENTION

The present invention resides in a method for reducing targeting errors encountered when trying to locate contaminant particles in a high-magnification imaging device, based on estimates of the particle positions obtained from a scanning device. The basic method over which the invention provides substantial improvement includes the steps of (a) scanning a semiconductor wafer in a scanning device to produce signals pertaining to the positions and sizes of contaminant particles on the wafer; (b) selecting two reference particles that are relatively recognizable because of their size and contrast; (c) obtaining estimated coordinates of the reference particles from the scanning device; (d) moving the semiconductor wafer to a high-magnification imaging device; (e) finding the reference particles in the imaging device and obtaining their corresponding actual coordinates in the imaging device; (f) calculating the parameters for a coordinate transformation between the coordinate systems of the scanning device and the imaging device, based on the reference particles and their estimated coordinates and actual coordinates; and (g) transforming the coordinates of other particles on the wafer from values obtained from the scanning device to estimated values in the coordinate system of the imaging device, to facilitate location and further analysis of the particles in the imaging device.

In accordance with a first aspect of the invention, at least three reference particles are selected, and the step of calculating the parameters for the coordinate transformation is performed using multiple unique pairs of the reference particles and their estimated coordinates and actual coordinates. More specifically, if three reference particles are selected three unique pairs of particles provide for three separate calculations of the coordinate transformation parameters. The results of the calculations are averaged to provide a more accurate coordinate transformation, which results in greatly reduced targeting errors for the other particles on the wafer.

Greater targeting accuracy is obtained when the three or more reference particles are selected such that at least some of them span an area of interest on the wafer, and such that none of them is too close to another.

In accordance with another aspect of the invention, targeting errors pertaining to non-reference particles are further reduced if multiple scans are performed in the scanning device and the results of the scans are logically combined. Logical combination of the multiple scan results may include eliminating particles that are reported in only one scan, and may also include averaging positional data obtained from the multiple scans.

In accordance with a third aspect of the invention, targeting of reference particles is rendered more accurate by maintaining an accumulated reference particle targeting error, calculated by averaging the reference particle targeting errors observed over a succession of wafers being processed. The accumulated target error, which is preferably an average over a predetermined number of most recently processed wafers, is then applied to the imaging device before trying to locate each reference particle, to eliminate or reduce any positioning error due to some repeatable factor, such as a consistent operator error or a nearly constant offset in the scanning device or the imaging device.

It will be appreciated from the foregoing that the present invention represents a significant advance over prior techniques for locating and analyzing contaminant particles on the surface of a semiconductor mirror wafer. Other aspects and advantages of the invention will become apparent from the following more detailed description, taken in conjunction with the accompanying drawings.

BRIEF DESCRIPTION OF THE DRAWINGS

FIG. 2b is graph showing the targeting error for each of fifteen run particles, using different selections of reference particles as indicated in FIG. 2a;

DESCRIPTION OF THE PREFERRED EMBODIMENT

Figure 1:
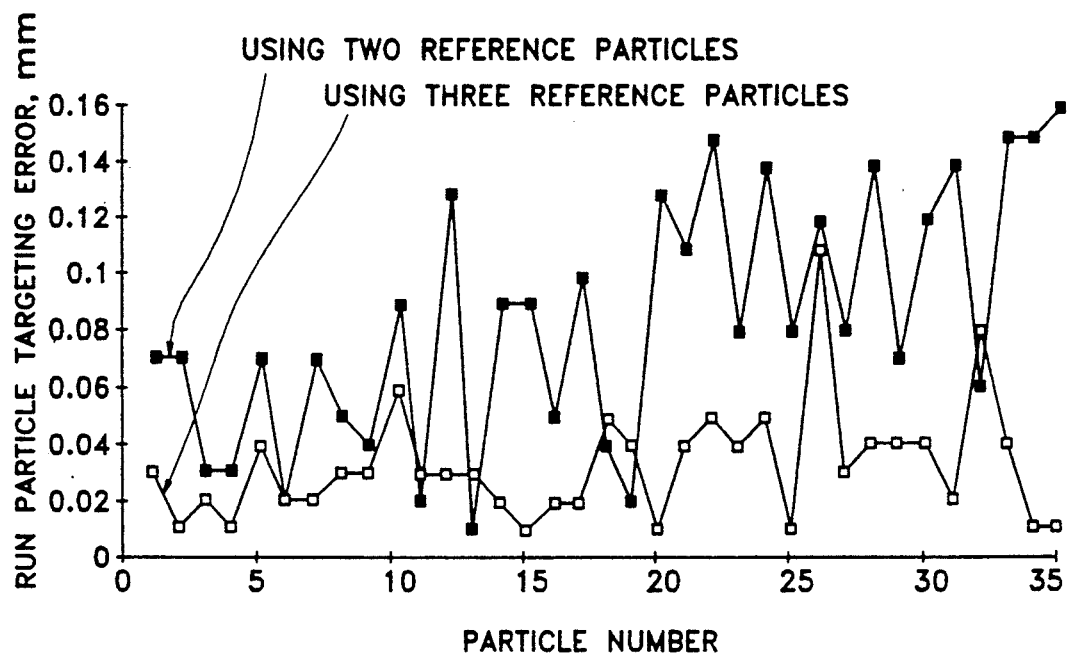
FIG. 1 includes two graphs showing the run particle targeting error for each of thirty-five particles, using two and three reference particles, respectively.

As shown in the drawings for purposes of illustration, the present invention is concerned with an improved technique for locating contaminant particles on a semiconductor mirror wafer. Basically, the invention provides significantly reduced targeting error values. That is to say, the method of the invention allows the prediction of particle to be located when using an imaging device, such as a scanning electron microscope (SEM).

As mentioned above, semiconductor feature sizes below the 1 $\mu$m level and large wafer sizes have made it extremely difficult to locate and identify all of the contaminant particles on a mirror wafer. A two-stage technique has been developed, first using a laser scanning device to map practically the entire wafer and to provide an estimate of the locations and sizes of particles on the wafer surface. Then the wafer is moved to a scanning electron microscope (SEM) or similar device, and as many particles as possible are located and further analyzed. The coordinates of each particle are transformed from the coordinate system of the laser scanning device to the coordinate system of the SEM, using two reference particles that can be readily identified in both devices because of their size and contrast. Because of the high magnification factor that must be used in the SEM, the estimated particle positions obtained from the laser scanning device must be very accurate, or it will be difficult or impossible to locate the particles using the SEM. The principal difficulty with this approach has been that the average targeting error of "run" particles, i.e. particles other than the selected reference particles, is typically in the range 100–150 $\mu$m, but a targeting error of approximately 37.5 $\mu$m or less is needed to reliably locate a 0.1 $\mu$m particle using a magnification of 2000×. If the targeting error is greater than this, the particle will be outside the field of an SEM viewing screen and may be impossible to find.

In accordance with the present invention, the average targeting error is significantly reduced by novel techniques used in the first or particle recognition stage, and in the selection of reference particles used for coordinate transformation. In this first stage, a wafer is introduced into a laser scanning device, such as a Tencor SurfScan 5000, manufactured by Tencor Instruments, which scans the surface of the wafer in a raster fashion and produces signals from which a display of the particles on the wafer is generated, as indicated in FIG. 2a.

Prior to this invention, two reference particles were selected from the results provided by the scanning device, and the same two reference particles had to be found using the imaging device, using as a first estimate the x and y coordinates provided by the scanning device. Once the two reference particles were found in the imaging device, their actual x and y coordinates could be obtained. Then, from the x and y coordinates of the two reference particles in both the scanning device frame of reference and the imaging device frame of reference, parameters could be calculated that would permit transformation of particle coordinates from one frame of reference to the other. In general, transformation between two coordinate systems may be completely defined by an offset value and a rotation angle. That is to say, the transformation from one coordinate system to another can be considered to include a linear movement of the x and y axes so that the new origin assumes a position displaced from the old origin, together with a rotation of the axes about the origin to a new angular orientation. Such coordinate transformations are extremely well known, and the simple equations for performing them may be found in almost any basic text on linear algebra, coordinate geometry, or related subject matter. For example, the transformations are completely defined in a text by John J. Craig entitled "Introduction to Robotics: Mechanics and Control," 2nd edition, published by Addison-Wesley Publishing Company, Inc. (1989), and specifically on pages 25-30. The transformation equations may also be found in "Elementary Linear Algebra," by Howard Anton, pp. 229-30, published by Anton Textbooks, Inc. (1987).

In accordance with one important aspect of the invention, three or more reference particles are selected instead of two. When three reference particles are used, three unique sets of coordinate transformation parameters can be calculated, instead of the single transformation that is possible when only two reference particles are used. Basically, the transformation parameters include an offset through which the axes are moved from one coordinate system to the other, and a rotation angle. The three sets of transformation parameters are simply averaged, or mathematically combined in some other way, to provide a much more accurate estimate of the particle location. FIG. 1 shows, in general, the effect on the run particle targeting error of using three reference particles instead of two. The upper set of plotted errors, shown as solid squares, are those resulting from the use of two reference particles, while the lower set of plotted errors, shown as open squares, are those resulting from the use of three reference particles. It will be observed that the targeting errors resulting from the use of three reference particles are nearly all less than about 0.05 mm (50 $\mu$m), while the targeting errors resulting from the use of only two reference particles range as high as 0.16 mm (160 $\mu$m).

Figure 2A:
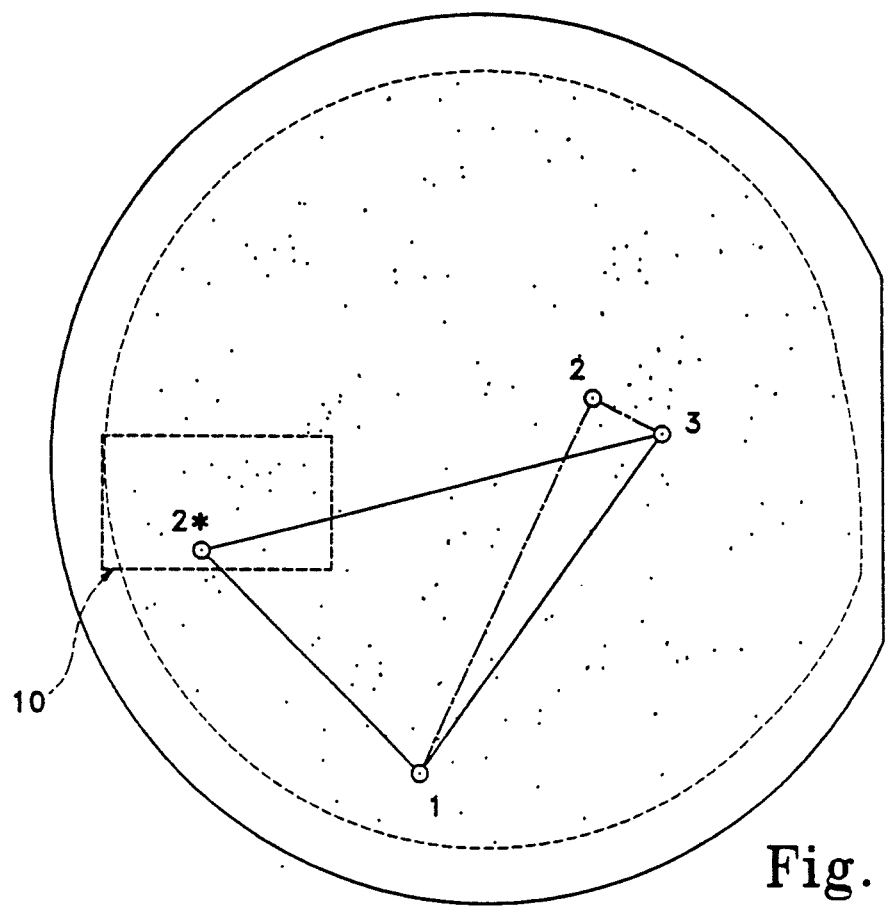
FIG. 2a is diagrammatic view of a wafer display obtained from a laser scanning device, showing the locations of reference particles and other particles.
Figure 2B:
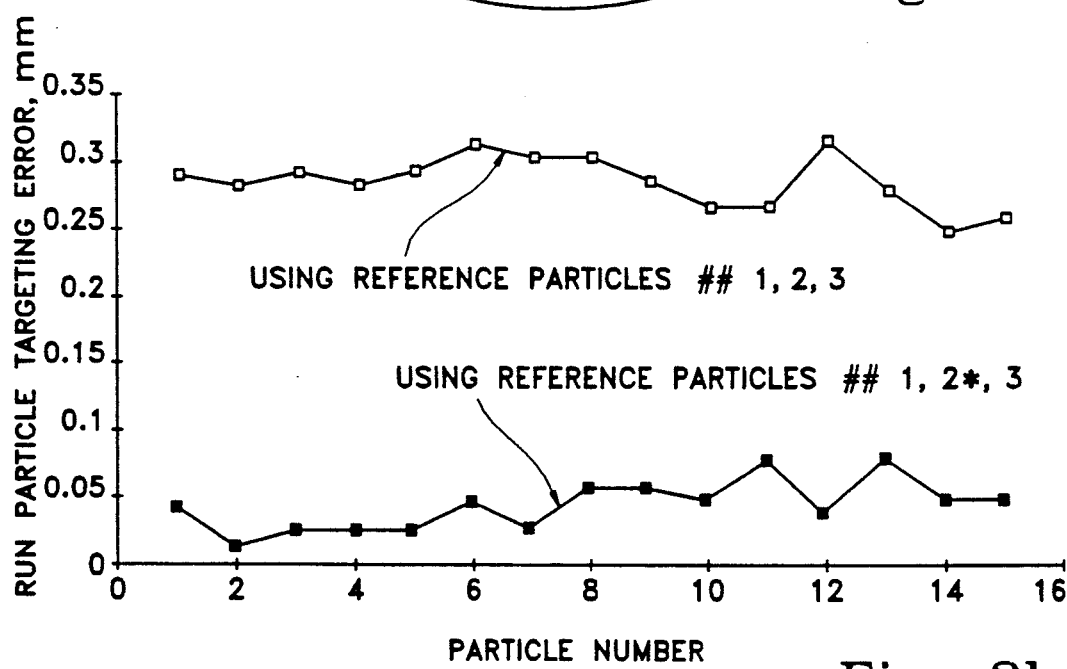

FIGS. 2a and 2b show the effect of selection of reference particles, on the targeting errors pertaining to fifteen particles in a rectangular area of interest, indicated by reference numeral 10 and drawn with broken lines. When reference particles indicated at 1, 2 and 3 are selected, the resulting targeting errors, shown in the upper curve in FIG. 2b, are approximately in the range 0.25-0.30 mm (250-300 $\mu$m). However, when reference particles 1, 2* and 3 are selected, the resulting targeting errors, shown in the lower curve in FIG. 2b, are approximately in the range 0-0.05 mm (0-50 $\mu$m). This illustrates two aspects of the invention. First, when selecting three reference points, no two of the points should be too close together, as are points 2 and 3. If they are, any advantage to having three reference points may be lost, since the transformation using points 1 and 3 is probably nearly the same as the transformation using points 1 and 2. Secondly, because targeting errors typically vary widely with location on the wafer, the reference particles should be selected such that at least one of the reference particles falls within the area of interest, or such that the reference particles at least partially surround the area of interest. As can be observed from FIG. 2b, following these simple guidelines results in a dramatic reduction in targeting error, by a factor of approximately six.

In accordance with another aspect of the invention, statistical error data pertaining to reference particles on previously processed wafers are used in the processing of a new wafer. As each wafer is processed, it may be subject to identical or nearly identical reference particle target errors. For example, an operator may unknowingly subject each wafer to a nearly constant offset or skew when placing the wafer in the SEM or in the laser scanning device. Moreover, the devices themselves may introduce a constant positioning error when a wafer is moved to the SEM. To eliminate errors of this type, the reference particle targeting errors for prior wafers are taken into account when positioning the SEM to locate a reference particle on a new wafer. Specifically, if a first wafer has a reference particle targeting error of $e_1$, where $e_1$ is a vector quantity, the SEM will be positionally adjusted by the same vector quantity $e_1$ (or $-e_1$, depending on how the error vector quantity is defined), when searching for a reference particle on a second wafer. Thus, if the targeting error encountered in locating a reference particle on the first wafer is a nearly constant offset or skew of the type discussed above, this error will be eliminated when processing the second wafer.

Figure 3:
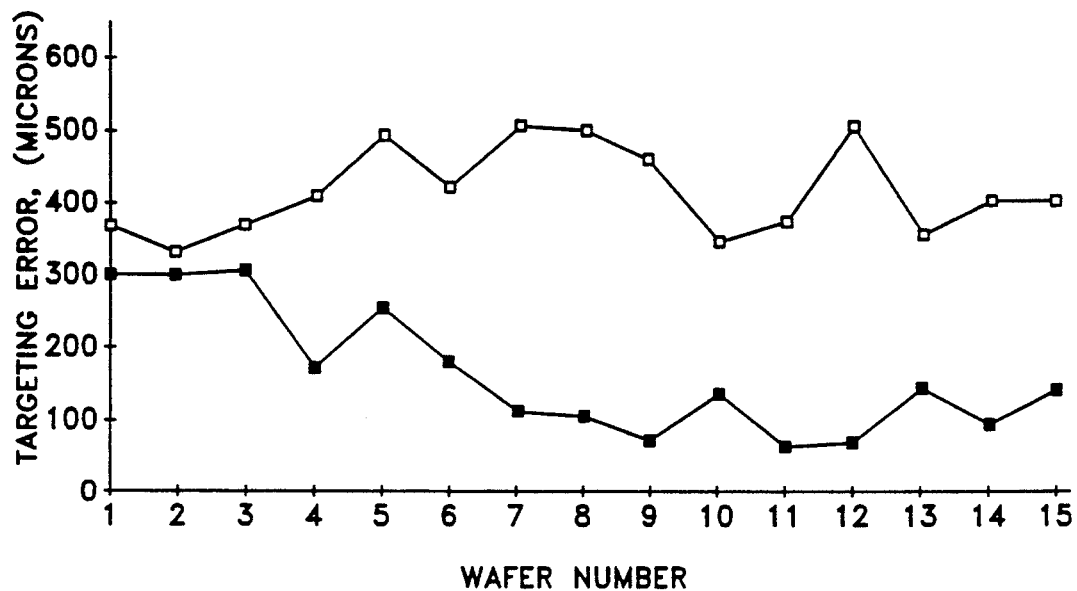
FIG. 3 is a graph plotting the reference particle targeting error as a function of the number of wafers analyzed, and showing the reduction in the targeting error obtained by using statistical reference particle error data from previous wafers.

In the presently preferred embodiment of the invention, reference particle targeting errors for the last n wafers to be processed are saved and averaged together. For example, the correction to be applied when trying to locate a reference particle on a wafer may represent the average of the targeting errors encountered in processing the previous twenty wafers. FIG. 3 shows how the reference particle targeting error can be decreased by this process. The upper curve shows how the reference particle targeting error, expressed as a scalar quantity, varies in processing fifteen wafers. The lower curve shows the improvement that results from using statistical error data from previously processed wafers.

The targeting error in the positions of run particles, i.e. those that are not reference particles, can be further improved by an additional technique wherein an additional one or more scans are made of the wafer during the first stage of processing in the laser scanning device. The laser scanning process is subject to errors of various kinds, such as positional errors, and even false reporting of particles. Therefore, a single scan of a wafer may result in reporting particles that are not really present, or may provide inaccurate particle position data. In accordance with this aspect of the invention, a second scan is made of the wafer, to permit elimination or minimization of this erroneous data. Particle position errors are minimized by averaging the positional data generated as a result of the two scans, and false reports of particles can be eliminated by deleting reports of particles that do not show up in both scans of the wafer.

Figure 4:
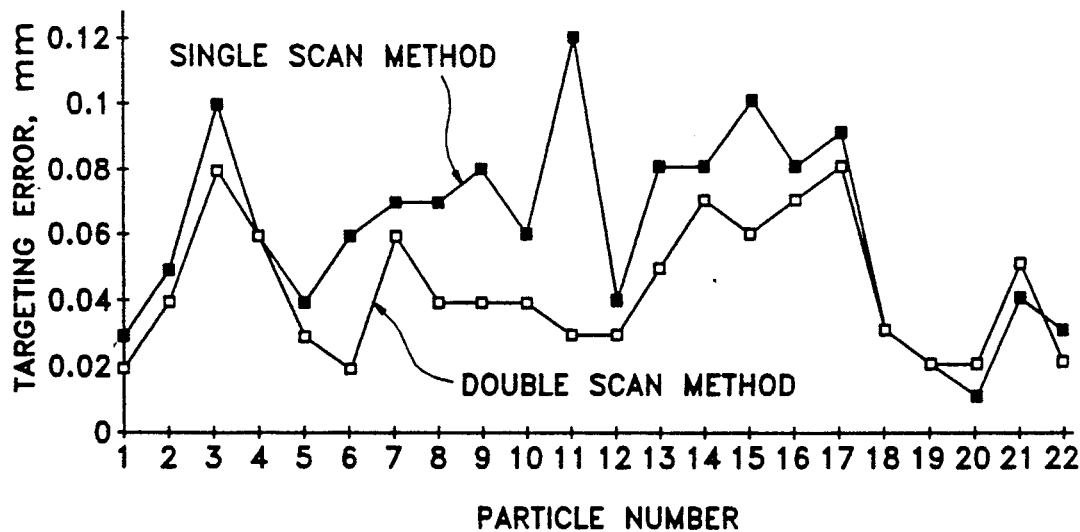
FIG. 4 is a graph showing the reduction in run particle (non-reference particle) target error obtained by using a double scan.

FIG. 4 shows how the run particle targeting errors are, in general, reduced by using a double scan of each wafer in the laser scanning device. The lower curve, plotted as solid squares, results from the double-scan method and shows a significant reduction in targeting error as compared with the single-scan approach, shown by the upper curve, plotted as solid squares.

It will be appreciated from the foregoing that the present invention represents a significant advance in the field of detection and analysis of contaminant particles in a semiconductor processing environment. In particular, targeting errors are dramatically reduced by using three techniques, either separately or in combination. The first technique reduces run particle targeting errors by the selection of more than two reference particles to perform a coordinate transformation, and selecting reference particles that fall into or around an area of interest on the wafer. The second technique reduces reference particle targeting errors by using statistical error data accumulated in the processing of different wafers. The third technique reduces run particle targeting errors by making multiple scans of the wafer during the first stage of processing, to eliminate falsely reported particles and to average positional data for increased accuracy.

It will also be appreciated that, although an embodiment of the invention has been described in detail for purposes of illustration, various modifications may be made without departing from the spirit and scope of the invention. Therefore, the invention is not to be limited except as by the appended claims.

We claim:

1. A method for reducing errors in locating particles on a semiconductor wafer, the method comprising the steps of:
   (a) scanning a semiconductor wafer in a scanning device to produce signals pertaining to the positions and sizes of contaminant particles on the wafer;
   (b) selecting at least three reference particles that are relatively recognizable because of their size and contrast;
   (c) obtaining estimated coordinates of the reference particles from the scanning device;
   (d) moving the semiconductor wafer to a high-magnification imaging device;
   (e) finding the reference particles in the imaging device and obtaining their corresponding actual coordinates in the imaging device;
   (f) calculating the parameters for a coordinate transformation between the coordinate systems of the scanning device and the imaging device, based on multiple unique pairs of the reference particles and their estimated coordinates and actual coordinates; and
   (g) transforming the coordinates of other particles on the wafer from values obtained from the scanning device to estimated values in the coordinate system of the imaging device, to facilitate location and further analysis of the particles in the imaging device.

2. A method as defined in claim 1, wherein the step (f) of calculating the parameters for a coordinate transformation includes:
   calculating the parameters for the coordinate transformation based on the coordinates of each of multiple unique pairs of reference particles; and
   averaging corresponding parameters obtained in the preceding step, to obtain an averaged set of transformation parameters for use in the transforming step.

3. A method as defined in claim 2, wherein:
   the reference particles are selected such that they are spaced relatively uniformly with respect to each other; and
   the reference particles are selected such that at least some of them span an area of interest on the wafer.

4. A method as defined in claim 3, wherein the number of selected reference particles is three.

5. A method as defined in claim 1, and further comprising the steps of:
   repeating scanning step (a) at least once; and
   combining the results of the original and repeated scanning steps to reduce the number of erroneously reported particles on the wafer.

6. A method as defined in claim 5, wherein the step of combining the results of the scanning steps includes ignoring particles that are detected as a result of only one of the scanning steps.

7. A method as defined in claim 5, wherein the step of combining the results of the scanning steps includes combining inconsistent positional data pertaining to a particle.

8. A method as defined in claim 7, wherein the step of combining inconsistent positional data includes averaging the positional data obtained in the multiple scanning steps.

9. A method as defined in claim 1, wherein the method further comprises the steps of:
   repeating steps (a) through (g) to process additional wafers;
   observing, after each step (e), a reference particle targeting error, which is the difference between the estimated position of a reference particle and its actual position as located in the imaging device; and
   accumulating the observed reference particle targeting errors after each step (e), to compute an accumulated reference particle targeting error;
   wherein each step (e) of finding the reference particles in the imaging device further includes pre-positioning the imaging device based on the accumulated reference particle targeting error.

10. A method as defined in claim 9, wherein the accumulated reference particle targeting error is the average of a number of previously observed targeting errors.

11. A method as defined in claim 5, wherein the method further comprises the steps of:
    repeating steps (a) through (g) to process additional wafers;
    observing, after each step (e), a reference particle targeting error, which is the difference between the estimated position of a reference particle and its actual position as located in the imaging device; and
    accumulating the observed reference particle targeting errors after each step (e), to compute an accumulated reference particle targeting error;
    wherein each step (e) of finding the referenceparticles in the imaging device further includes pre-positioning the imaging device based on the accumulated reference particle targeting error.

12. A method as defined in claim 11, wherein the accumulated reference particle targeting error is the average of a number of previously observed targeting errors.

13. A method for reducing errors in locating particles on a semiconductor wafer, the method comprising the steps of:
    (a) scanning a semiconductor wafer in a scanning device to produce signals pertaining to the positions and sizes of contaminant particles on the wafer;
    (b) selecting at least two reference particles that are relatively recognizable because of their size and contrast;
    (c) obtaining estimated coordinates of the reference particles from the scanning device;
    (d) moving the semiconductor wafer to a high-magnification imaging device;
    (e) finding the reference particles in the imaging device and obtaining their corresponding actual coordinates in the imaging device;

(f) calculating the parameters for a coordinate transformation between the coordinate systems of the scanning device and the imaging device, based on two reference particles and their estimated coordinates and actual coordinates;

(g) transforming the coordinates of other particles on the wafer from values obtained from the scanning device to estimated values in the coordinate system of the imaging device, to facilitate location and further analysis of the particles in the imaging device;

(h) repeating scanning step (a) at least once; and (i) combining the results of the original and repeated scanning steps to reduce the number of erroneously reported particles on the wafer.

14. A method as defined in claim 13, wherein the step of combining the results of the scanning steps includes ignoring particles that are detected as a result of only one of the scanning steps.

15. A method as defined in claim 13, wherein the step of combining the results of the scanning steps includes combining inconsistent positional data pertaining to a particle.

16. A method as defined in claim 15, wherein the step of combining inconsistent positional data includes averaging the positional data obtained in the multiple scanning steps.

17. A method for reducing errors in locating particles on a semiconductor wafer, the method comprising the steps of:

(a) scanning a semiconductor wafer in a scanning device to produce signals pertaining to the positions and sizes of contaminant particles on the wafer;

(b) selecting at least two reference particles that are relatively recognizable because of their size and contrast;

(c) obtaining estimated coordinates of the reference particles from the scanning device;

(d) moving the semiconductor wafer to a high-magnification imaging device;

(e) finding the reference particles in the imaging device and obtaining their corresponding actual coordinates in the imaging device;

(f) calculating the parameters for a coordinate transformation between the coordinate systems of the scanning device and the imaging device, based on two reference particles and their estimated coordinates and actual coordinates;

(g) transforming the coordinates of other particles on the wafer from values obtained from the scanning device to estimated values in the coordinate system of the imaging device, to facilitate location and further analysis of the particles in the imaging device;

(h) repeating steps (a) through (g) to process additional wafers;

(i) observing, after each step (e), a reference particle targeting error, which is the difference between the estimated position of a reference particle and its actual position as located in the imaging device; and (j) accumulating the observed reference particle targeting errors after each step (e), to compute an accumulated reference particle targeting error;

wherein each step (e) of finding the reference particles in the imaging device further includes prepositioning the imaging device based on the accumulated reference particle targeting error.

18. A method as defined in claim 17, wherein the accumulated reference particle targeting error is the average of a number of previously observed targeting errors.

* * * * *